United States Patent [19]

Kato et al.

[11] Patent Number: 5,447,890

[45] Date of Patent: Sep. 5, 1995

[54] METHOD FOR PRODUCTION OF WAFER

[75] Inventors: Tadahiro Kato; Sunao Shima; Masami Nakano; Hisashi Masumura; Hideo Kudo, all of Fukushima, Japan

[73] Assignee: Shin-Etsu Handotai Co., Ltd., Tokyo, Japan

[21] Appl. No.: 210,437

[22] Filed: Mar. 21, 1994

[30] Foreign Application Priority Data

Mar. 24, 1993 [JP] Japan ................... 5-064896

[51] Int. Cl.$^6$ .......................................... H01L 21/304
[52] U.S. Cl. .................... 437/249; 437/946; 437/977; 148/DIG. 138
[58] Field of Search ................ 156/636, 645; 437/946, 437/974, 977, 249; 148/DIG. 17, DIG. 135, DIG. 138

[56] References Cited

U.S. PATENT DOCUMENTS

| 4,276,114 | 6/1981 | Takano et al. | 156/645 |
| 4,588,473 | 5/1986 | Hisatomi et al. | 156/645 |
| 5,071,776 | 12/1991 | Matsushita et al. | 437/946 |
| 5,097,630 | 3/1992 | Maeda et al. | 51/50 R |

FOREIGN PATENT DOCUMENTS 63-293813 11/1988 Japan .
63-301529 12/1988 Japan .

Primary Examiner—George Fourson
Assistant Examiner—Thomas G. Bilodeau
Attorney, Agent, or Firm—Ronald R. Snider

[57] ABSTRACT

A wafer which allows manufacture of a device to proceed at an exalted yield by preventing the resolution of exposure at the step of photolithography during the manufacture of the device from being impaired is obtained by a method which comprises a slicing step for slicing a single crystal ingot thereby obtaining wafers of the shape of a thin disc, a chamfering step for chamfering the wafer obtained by the slicing step, a lapping step for imparting a flat surface to the chamfered wafer, an etching step for removing mechanical strain remaining in the lapped wafer, an obverse surface-polishing step for polishing one side of the etched wafer, and a cleaning step for cleaning the polished wafer, which method is characterized by interposing between the etching step and the obverse surface-polishing step a reverse surface-preparing step for preparing the shape of the reverse side of the wafer.

3 Claims, 6 Drawing Sheets

FIG. 5(A) Prior Art ⟨ Wafer having an undulation on the reverse side ⟩
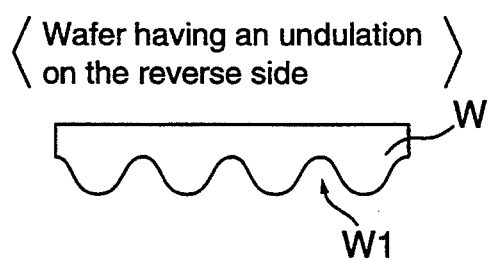
FIG. 5(B) Prior Art
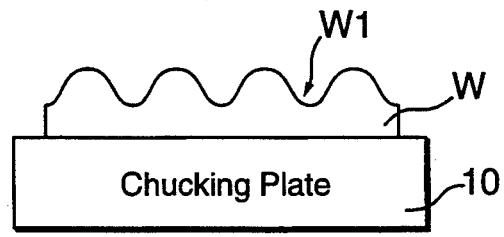

METHOD FOR PRODUCTION OF WAFER

BACKGROUND OF THE INVENTION

1. Field of the Invention

This invention relates to a method for the production of a semiconductor wafer, particularly a single crystal silicon wafer (hereinafter referred to simply as "wafer").

2. Prior Art Statement

Generally, the method for the production of a wafer comprises a slicing step for slicing a single crystal ingot pulled up by a single crystal pulling device thereby obtaining wafers of the shape of a thin disc, a chamfering step for chamfering the peripheral edge part of the wafer obtained by the slicing step thereby preventing the wafer from cracking or chipping, a lapping step for lapping the chamfered wafer thereby flattening the surface thereof, an etching step for depriving the lapped wafer of residual mechanical strain, a surface-polishing step for polishing one surface of the etched wafer, and a cleaning step for cleaning the polished wafer thereby removing abrasive and foreign matter adhering thereto.

The wafer which is produced after the various steps mentioned above, however, entails the following objectionable effects because an etched surface remains forever on the reverse side thereof.

A mixed acid is generally used as the etchant for the etching step mentioned above. When the etching treatment of a wafer is carried out by the use of this mixed acid, a large undulation W1 having a period in the approximate range of 0.5 to 1 mm and a P-V (peak to valley) value in the approximate range of 0.1 to 0.5 $\mu$m, the magnitudes peculiar to the mixed acid, persists on the reverse side of a wafer W which has not undergone the surface polishing mentioned above as illustrated in FIG. 5 (a) (depicting the wafer W in a free state).

When the reverse side of the wafer W is fastened to a chucking plate 10 at the step of photolithography in the process of production of a device, the undulation W1 mentioned above on the reverse side transfers toward the obverse side and gives rise to an undulation W1' on the obverse side as illustrated in FIG. 5 (b). This undulation W1' degrades the resolution of exposure and consequently causes a decline in the yield of the device.

As means to solve the problem mentioned above, the method of polishing both the obverse and the reverse sides of the wafer W as illustrated in FIG. 6 (a) may be conceived. In accordance with this method, since the undulation W1 illustrated in FIG. 5 (a) is absent from the reverse side of the wafer W, the problem mentioned above does not arise even when the reverse side of the wafer W is fastened through aspiration to the chucking plate 10 as illustrated in FIG. 6 (b) at the step of photolithography.

According to the method involving the polishing of both sides as described above, since the reverse side of the wafer W acquires a mirror surface, the problem arises that the popular wafer sensor which is capable of detecting the presence of a wafer by the scattering of light fails to detect the wafer W. When the wafer W is fastened through aspiration to the chucking plate 10, since an extraneous particle P accidentally adhering to the reverse side of the wafer W and intervening between the wafer W and the chucking plate 10 elastically deforms the wafer W as illustrated in FIG. 6 (c), the same problem as mentioned above ensues that the part of the obverse surface of the wafer W which overlies the extraneous particle P forms a protuberance W2 and undulates the obverse surface of the wafer W.

This invention, produced by an urge to eliminate the problem mentioned above, has for its object the provision of a method for the production of a wafer which permits detection by a sensor, avoids degrading the resolution of exposure at the step of photolithography during the process of manufacture of a device, and improves the yield of the device.

SUMMARY OF THE INVENTION

To accomplish the object described above, this invention provides a method for the production of a wafer which comprises a slicing step for slicing a single crystal ingot thereby obtaining wafers of the shape of a thin disc, a chamfering step for chamfering the wafer obtained by the slicing step, a lapping step for imparting a flat surface to the chamfered wafer, an etching step for removing mechanical strain remaining in the lapped wafer, an obverse surface-polishing step for polishing one side of the etched wafer, and a cleaning step for cleaning the polished wafer, which method is characterized by interposing between the etching step and the surface-polishing step a reverse surface-preparing step for preparing the shape of the reverse side of the wafer.

As concrete examples of the reverse surface-preparing step mentioned above, the combination of a reverse surface-polishing step for removing an undulation formed on the reverse side of the wafer in consequence of the operation of the etching step with a step of etching treatment for exalting the roughness of the reverse surface of the wafer polished at the reverse surface-polishing step, the combination of the reverse surface-polishing step mentioned above with a step of etching treatment for promoting a preferential etching action on the reverse side of the wafer polished by the operation of the reverse surface-polishing step and exalting the roughness of the reverse surface of the wafer, and the combination of the reverse surface-polishing step mentioned above with a BHF treatment step for exalting the roughness of the reverse surface of the wafer polished by the operation of the reverse surface-polishing step mentioned above may be cited.

When the combination of the reverse surface-polishing step with the step of etching treatment is employed as the reverse surface-preparing step in the method of this invention, for example, since the undulation formed on the reverse side of the wafer in consequence of the operation of the preceding etching step is removed by the reverse surface-polishing step, the transfer of the undulation on the reverse side of the wafer toward the obverse surface side entailed by the conventional method does not occur any longer when the wafer is fastened through aspiration to the suction disc at the step of photolithography in the manufacture of a device. As a result, the flatness of the obverse surface of the wafer is kept at a high level, the resolution of exposure is kept similarly at a high level, and the yield of device is prevented from decreasing. The reverse surface-polishing step in the reverse surface-preparing step polishes the reverse surface of the wafer to such an extent as to remove the undulation of the reverse surface of the wafer without impairing the flatness of the wafer produced by the etching of the preceding step.

In the reverse surface-preparing step, the wafer which has been deprived of the undulation of the reverse surface thereof at the reverse surface-polishing step has the roughness of the reverse surface thereof exalted at the subsequent step of etching treatment. The sensor now is capable of detecting the wafer owing to the exalted roughness. Further, since the reverse surface of the wafer absorbs extraneous particles in the valleys of the acquired surface roughness, the extraneous particles accidentally present produce no adverse effects on the obverse surface side of the wafer. For the same reason as given above, the otherwise possible impairment of the yield of device can be prevented. The step of etching treatment in the reverse surface-preparing step exalts exclusively the roughness of the reverse surface of the wafer to an extent enough to absorb the extraneous particles without impairing the flatness of the wafer.

The combination of the aforementioned reverse surface-polishing step with a sandblasting step and a step of etching treatment or the combination of the reverse surface-polishing step with a BHF treatment step to be adopted as the reverse surface-preparing step can be expected to bring about the same effect as described above.

BRIEF DESCRIPTION OF THE DRAWINGS

The invention will be better understood and the objects and features thereof other than those set forth above will become apparent when consideration is given to the following detailed description thereof, which makes reference to the annexed drawings wherein:

FIG. 5 (a) is a diagram illustrating a wafer produced by the conventional method (the wafer having an undulation on the reverse side) as posed in a free state and FIG. 5 (b) a diagram illustrating the same wafer as fastened through aspiration to a suction disc.

DETAILED DESCRIPTION OF THE PREFERRED EMBODIMENTS

Figure 1:
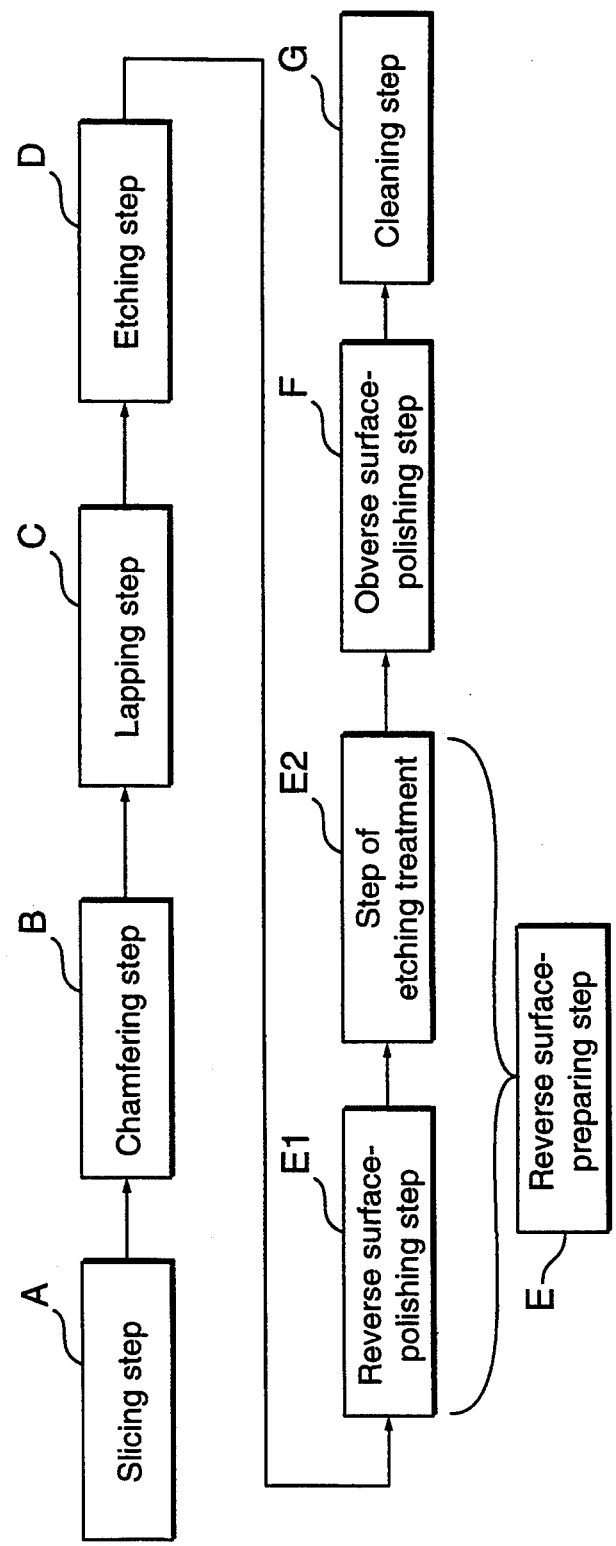
FIG. 1 is a block diagram illustrating sequentially in the order of the component steps of the method for the production of a wafer as the first embodiment of this invention.

FIG. 1 is a block diagram illustrating sequentially in the order of occurrence the component steps of the method for the production of a wafer according to the first embodiment of this invention.

The method for the production of a wafer according to this invention is characterized by having a reverse surface-preparing step for preparing the shape of the reverse surface of the wafer incorporated in the conventional process between an etching step and an obverse surface-polishing step. The present embodiment adopts the combination of a reverse surface-polishing step with a step of etching treatment as the reverse surface-preparing step.

Now, the method for the production of a wafer according to the present embodiment will be described below with reference to FIG. 1 which illustrates the component steps of the method sequentially in the order of occurrence.

First, at a slicing step A, a single crystal ingot pulled up by a single crystal pulling device not shown is sliced at a right angle or at a certain angle relative to the axial direction of the ingot to obtain a plurality of wafers of the shape of a thin disc.

The wafer obtained after the slicing step A mentioned above has the peripheral edge part thereof chamfered at a chamfering step B by way of protection against cracking and chipping. The chamfered wafer is then lapped with a lapping machine not shown at the next lapping step C.

Then, the lapped wafer is subjected to an etching treatment with a mixed acid at the subsequent etching step D and is deprived of mechanical strain accumulated throughout the entire obverse surface thereof. In consequence of the etching step D, a large undulation having a period in the approximate range of 0.5 to 1 mm and a P-V value in the approximate range of 0.1 to 0.5 $\mu$m, the magnitudes inherent in the mixed acid, is formed on each of the opposite surfaces of the wafer.

Incidentally, since the next obverse surface-polishing step F generally polishes only one surface of the wafer, the undulation formed on the obverse surface of the wafer by the operation of the etching step D remains forever and entails such objectionable effects as mentioned above.

The present embodiment, therefore, has the combination of a reverse surface-polishing step E1 with a step E2 of etching treatment as a reverse surface-preparing step E interposed between the aforementioned etching step D and an obverse surface-polishing step F as described above.

The reverse surface-polishing step E1 is intended to remove the undulation formed on the reverse surface of the wafer by the operation of the preceding etching step D. This reverse surface-polishing step E1, therefore, is only required to polish the reverse surface of the wafer to an extent sufficient to remove the undulation on the reverse surface of the wafer without impairing the flatness of the wafer which has been etched at the preceding step D. This polishing removes a thickness of the surface in the range of 3 to 5 $\mu$m under a low load, for example.

The wafer which has been deprived of the undulation by the operation of the reverse surface-preparing step E1 mentioned above has the roughness of the reverse surface thereof exalted at the next step E2 of etching treatment, with the result that a surface W3 vested with a roughness having an amply shorter period than the undulation W1 (in the approximate range of 1 to 10 μm, for example) and a P-V value in the approximate range of 0.1 to 0.5 μm is formed on the reverse surface of the wafer W. At this step E2 of etching treatment, since the etching treatment exclusively exalts the roughness of the reverse surface of the wafer to the extent of permitting absorption of extraneous particles by the valleys to be formed in the reverse surface of the wafer as described specifically afterward without impairing the flatness of the wafer, it uses an etchant of a specific composition (HF=30 to 50% by weight, $HNO_3$=5 to 20% by weight, and $H_2O$>40% by weight, for example) and removes a thickness of the surface in the approximate range of 1 to 3 μm.

The wafer which has the shape of the reverse surface thereof prepared by the reverse surface-preparing step E mentioned above is subjected to the next obverse surface-polishing step F to have the obverse surface thereof polished and made to acquire a mirror finish and is subsequently cleaned at the next cleaning step G for removal of abradant and other foreign matter adhering to the polished surface.

Figure 2A:
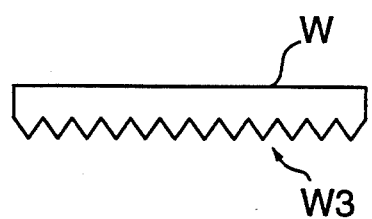
FIG. 2 (a) is a diagram illustrating a wafer produced by the method of this invention as posed in a free state and FIG. 2 (b) a diagram illustrating the same wafer in a state fastened through aspiration to a chucking plate.
Figure 2B:
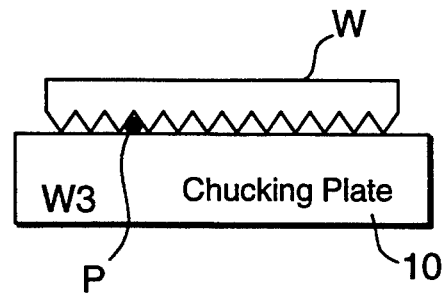

The series of steps of which the method for the production of a wafer according to the present embodiment is composed have been described above. The wafer W which had an undulation formed on the reverse side thereof at the preceding etching step D is deprived of the undulation at the reverse surface-polishing step E1 in the reverse surface-preparing step E and then the wafer W, as illustrated in FIG. 2 (b), is vested on the reverse side thereof with a surface W3 of a short-period roughness without a sacrifice of the flatness at the step E2 of etching treatment as described above. When the wafer W is fastened on the reverse side thereof through aspiration to the chucking plate 10 at the step of photolithography during the manufacture of a device, therefore, the undulation on the reverse surface of the wafer is not transferred toward the obverse surface side and extraneous particle P intervening between the wafer W and the chucking plate 10 is absorbed by being admitted into the valley in the undulation of the reverse surface of the wafer W as illustrated in the diagram. As a result, the present embodiment, unlike the conventional method, perfectly precludes the probability of the extraneous particle P giving rise to a mound in the obverse surface of the wafer W, keeps the flatness surface of the wafer W at a high level and the resolution of exposure at the step of photolithography in the manufacture of a device similarly at a high level, and allows the manufacture of the device to proceed at an exalted yield.

Further, since the wafer which has been deprived of the undulation of the reverse surface thereof in consequence of the operation of the aforementioned reverse surface-polishing step E1 is vested on the reverse side thereof with a roughness at the next step E2 of etching treatment, such a sensor as the wafer sensor which is capable of detecting the presence of a wafer by virtue of the scattering of light is permitted to detect this wafer W.

Figure 3:
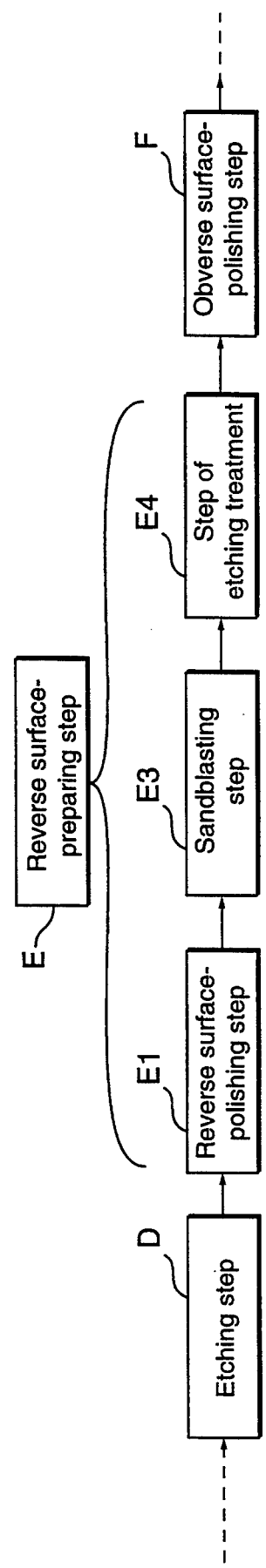
FIG. 3 is a block diagram illustrating a main part of the component steps (the part including an added reverse surface-preparing step and the immediately preceding and following steps) of the method for the production of a wafer according to the second embodiment of this invention.

Now, the second embodiment of this invention will be described with reference to FIG. 3. FIG. 3 is a block diagram illustrating a main part of the component steps (the part including an added reverse surface-preparing step and the immediately preceding and following steps) of the method for the production of a wafer according to the second embodiment. Since the present embodiment shares the same component steps with the conventional method except for the newly incorporated reverse surface-preparing step, the shared steps will be omitted from the following description.

This embodiment adopts, as the reverse surface-preparing step, the combination of the same reverse surface-polishing step E1 as in the first embodiment described above with a sandblasting step E3 for promoting a preferential etching operation and a step E4 of etching treatment for exalting the roughness of the reverse surface of the wafer by the preferential etching.

The reverse surface-polishing step E1 mentioned above is similar to that of the first embodiment described above and is intended to remove a long term undulation formed on the reverse surface of a wafer in consequence of the operation of the preceding etching step D.

In the present embodiment, the wafer which was deprived of the undulation on the reverse surface thereof by the reverse surface-polishing step E1 described above is vested on the reverse surface thereof with uniform strain by the blasting of the reverse surface with minute solid particles at the next sandblasting step and is subsequently enabled by the preferential etching operation of the next step E4 of etching treatment to increase the roughness of the reverse surface thereof in the same manner as in the first embodiment described above. Incidentally, since the step E4 of etching treatment in the present embodiment is intended for selectively etching the strain imparted to the reverse surface of the wafer, it performs the etching treatment with an etchant containing for example 0.5% by weight of NaOH (50 to 60° C.) for a period of about three minutes.

Figure 4:
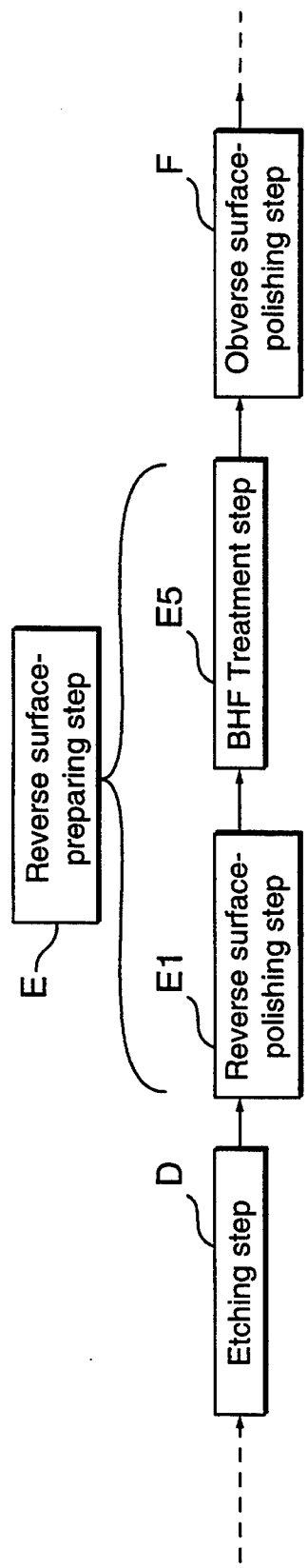
FIG. 4 is a block diagram illustrating a main part of the component steps (the part including an added reverse surface-preparing step and the immediately preceding and following steps) of the method for the production of a wafer according to the third embodiment of this invention.
Figure 6A:
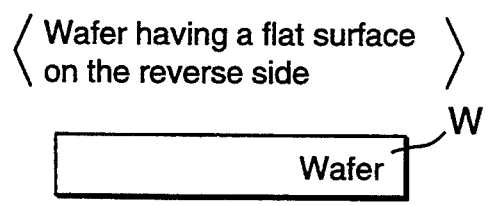
FIG. 6 (a) is a diagram illustrating a wafer produced by the conventional method (the wafer having polished surfaces on both sides) as posed in a free state and FIG. 6 (b) a diagram illustrating the same wafer as fastened through aspiration to a suction disc.
FIG. 6(c) is a diagram illustrating a fastening state in accordance with the conventional method when extraneous particles P intervene between the wafer W and the chucking plate 10.
Figure 6B:
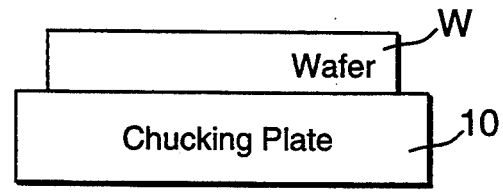
Figure 6C:
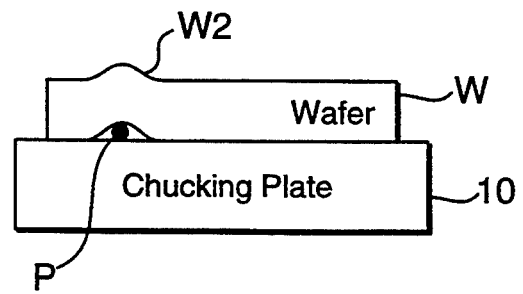

Now, the third embodiment of this invention will be described below with reference to FIG. 4. Incidentally, FIG. 4 is a block diagram illustrating a main part of the component steps (the part including the added reverse surface-adjusting step and the immediately preceding and following steps) of the method for the production of a wafer according to the third embodiment. The present embodiment similarly shares the same steps with the conventional method except for the newly incorporated reverse surface-preparing step. The shared steps, therefore, will be omitted from the following description.

This embodiment adopts as the reverse surface-preparing step the combination of the same reverse surface-polishing step E1 as in the first embodiment described above with a BHF treatment step E5.

The reverse surface-polishing step E1 mentioned above is similar to that of the first embodiment described above and is intended to remove a long term undulation formed on the reverse side of the wafer by the preceding etching step D.

In the present embodiment, on the wafer which was deprived of the undulation of the reverse surface thereof by the reverse surface-polishing step E1 described above, the next BHF treatment step E5 performs an etching operation with a BHF liquid (mixture of $NH_4OH$ with HF) for a period in the approximate range of 30 seconds to 10 minutes for example, to roughen the reverse surface of the wafer without a sacrifice of the flatness in the same manner as in the first and second embodiments described above.

Also in the second and the third embodiment, the same effect as that of the aforementioned first embodiment is attained because the wafer is deprived of the long term undulation of the reverse surface thereof by the reverse surface-adjusting step E and then is allowed to have the reverse surface thereof roughened to an extent enough to permit discernment of the presence of the wafer by means of a sensor and ensure absorption of an extraneous particle by a valley in the short term undulation.

It is clearly noted from the description given thus far that since the method of this invention for the production of a wafer comprises a slicing step for slicing a single crystal ingot thereby obtaining wafers in the shape of a thin disc, a chamfering step for chamfering the wafer obtained by the slicing step, a lapping step for imparting a flat surface to the chamfered wafer, an etching step for depriving the lapped wafer of mechanical strain, an obverse surface-polishing step for polishing one surface of the etched wafer, and a cleaning step for cleaning the polished wafer and features interposition of a reverse surface-preparing step for preparing the shape of the reverse surface of the wafer between the etching step and the obverse surface-polishing step, it permits production of a wafer which allows manufacture of a device to proceed at an exalted yield by preventing the resolution of exposure at the step of photolithography during the manufacture of the device from being impaired.

What is claimed is:

1. A method comprising
  a slicing step for slicing a single crystal ingot thereby obtaining wafers of the shape of a thin disc,
  a chamfering step for chamfering the wafer obtained by said slicing step,
  a lapping step for imparting a flat surface to the chamfered wafer,
  an etching step for removing mechanical strain remaining in the lapped wafer,
  an obverse surface-polishing step for polishing an obverse side of the etched wafer, and
  a cleaning step for cleaning the polished wafer,
  which method is characterized by interposing between said etching step and said obverse surface-polishing step a reverse surface-preparing step for preparing the shape of the reverse side of said wafer, wherein
  said reverse surface-preparing step comprises a reverse surface-polishing step for removing an undulation formed on the reverse surface of said wafer by said etching step and a step of etching treatment for exalting the roughness of the reverse surface of said wafer polished by said reverse surface-polishing step.

2. A method comprising
  a slicing step for slicing a single crystal ingot thereby obtaining wafers of the shape of a thin disc,
  a chamfering step for chamfering the wafer obtained by said slicing step,
  a lapping step for imparting a flat surface to the chamfered wafer,
  an etching step for removing mechanical strain remaining in the lapped wafer,
  an obverse surface-polishing step for polishing an obverse side of the etched wafer, and
  a cleaning step for cleaning the polished wafer,
  which method is characterized by interposing between said etching step and said obverse surface-polishing step a reverse surface-preparing step for preparing the shape of the reverse side of said wafer, wherein
  said reverse surface-preparing step comprises a reverse surface-polishing step for removing an undulation formed on the reverse surface of said wafer by said etching step, a sandblasting step for promoting preferential etching of the reverse surface of said wafer polished by said reverse surface-polishing step, and a step of etching treatment for exalting the roughness of the reverse surface of the sandblasted wafer.

3. A method comprising
  a slicing step for slicing a single crystal ingot thereby obtaining wafers of the shape of a thin disc,
  a chamfering step for chamfering the wafer obtained by said slicing step,
  a lapping step for imparting a flat surface to the chamfered wafer,
  an etching step for removing mechanical strain remaining in the lapped wafer,
  an obverse surface-polishing step for polishing one side of the etched wafer, and
  a cleaning step for cleaning the polished wafer,
  which method is characterized by interposing between said etching step and said obverse surface-polishing step a reverse surface-preparing step for preparing the shape of the reverse side of said wafer, wherein
  said reverse surface-preparing step comprises a reverse surface-polishing step for removing an undulation formed on the reverse surface of said wafer by said etching step and a buffered hydrofluoric acid treatment step for exalting the roughness of the reverse surface of said wafer polished by said reverse surface-polishing step.

* * * * *